United States Patent
Dreischer et al.

(10) Patent No.: US 7,991,294 B2
(45) Date of Patent: Aug. 2, 2011

(54) BI-DIRECTIONAL OPTICAL COMMUNICATIONS SYSTEM AND CORRESPONDING METHOD

(75) Inventors: Thomas Dreischer, Opfikon (CH); Michael Tüchler, Zürich (CH)

(73) Assignee: Oerlikon Space AG, Zurich (CH)

( * ) Notice: Subject to any disclaimer, the term of this patent is extended or adjusted under 35 U.S.C. 154(b) by 806 days.

(21) Appl. No.: 11/942,070

(22) Filed: Nov. 19, 2007

(65) Prior Publication Data
US 2008/0131134 A1    Jun. 5, 2008

(30) Foreign Application Priority Data
Dec. 4, 2006   (EP) ..................................... 06125318

(51) Int. Cl.
H04B 10/00   (2006.01)

(52) U.S. Cl. ............. 398/137; 398/129; 398/135

(58) Field of Classification Search ......... 398/128–131, 398/135, 137, 138, 41, 140, 141, 156, 158
See application file for complete search history.

(56) References Cited

U.S. PATENT DOCUMENTS

| | | | |
|---|---|---|---|
| 5,392,148 A | | 2/1995 | Takahashi |
| 6,151,340 A | * | 11/2000 | Rivers .............................. 372/32 |
| 6,323,980 B1 | * | 11/2001 | Bloom ........................... 398/129 |
| 2002/0131121 A1 | * | 9/2002 | Jeganathan et al. ........... 359/152 |
| 2003/0067657 A1 | * | 4/2003 | Dimmler et al. .............. 359/159 |
| 2004/0208616 A1 | | 10/2004 | Melendez |

FOREIGN PATENT DOCUMENTS

| | | |
|---|---|---|
| EP | 1134917 A2 | 9/2001 |
| JP | 61048250 | 3/1986 |

* cited by examiner

*Primary Examiner* — Dalzid Singh
(74) *Attorney, Agent, or Firm* — McCormick, Paulding & Huber LLP (57) ABSTRACT

Bi-directional laser communications system comprising a first transceiver and a second transceiver for establishing two optical channels there between. The first transceiver comprises a first transmitter with a pulsed high-power laser source for transmitting a pulsed beacon laser signal into a first of said optical channels. The second transceiver comprises a receiver with an optical antenna for receiving said pulsed beacon laser signal, said second transceiver and/or a receiving optic of said second transceiver being adjustable so that it can be adjusted with respect to said pulsed beacon laser signal. The second transceiver further comprises a second transmitter with a laser for transmitting a high energy laser signal into a second of said optical channels, and means for a separation of said first optical channel and said second optical channel. These means prevent the high energy laser signals from being transmitted into said second optical channel whenever said pulsed beacon laser signal is expected to arrive through said first optical channel.

19 Claims, 4 Drawing Sheets

BI-DIRECTIONAL OPTICAL COMMUNICATIONS SYSTEM AND CORRESPONDING METHOD

RELATED APPLICATION DATA

This patent application claims benefit of the priority of the European Patent Application No. EP 06 125 318.3 filed on the 4 Dec. 2006.

BACKGROUND OF THE INVENTION

1. Field of the Invention

The present invention concerns a bi-directional communications system and a method for bi-directional optical communication. The system and method presented herein is very well suited for communication with a satellite in deep space, for instance.

2. Related Prior Art

So far mainly radio frequency (RF) links are used in order to provide for a communication between a ground station and a terminal carried by a satellite in deep space. In such communications systems typically one terminal is attached to the satellite whereas another terminal is either a ground based terminal or a terminal carried aboard of a second satellite in an orbit closer to the earth.

Various researchers and developers, however, are currently developing optical links to support deep-space communication to satellites.

The longer the distance between the two communication terminals gets, the more careful the link budget has to be designed. In particular the downlink budget, that is the budget of the link between the satellite in deep space and a ground based terminal, or a terminal in a lower orbit, has to be designed with great care.

SUMMARY OF THE INVENTION

It is an object of the present invention to provide a communications system for communication between two remote terminals, where even at very long distances between these two terminals and/or at very small signal-to-noise ratios a robust communication is possible.

It is an object of the present invention to provide a corresponding method.

According to the present invention, an optical communications system is provided for communication between two optical terminals. At both terminals power laser sources are used in order to be able to emit optical signals of sufficient energy.

Due to the physical effect during opto-electrical power conversion, an increase $dP_{opt}$ in optical power results in an increase of the current $dI_{el}$ at the output of an optical detector, which in turn yields an increase $(dI_{el})^2 \cong (dP_{opt})^2$ of the electrical signal power $(dI_{el})^2$ that is taken for demodulation of the information signal. This "square law" nature of opto-electrical power conversion pays off especially for the case of high pulse peak powers. Despite of increased electrical noise power due to higher bandwidth $B \approx 0.5/T_{slot}$ for narrow pulses of duration Tslot, the electrical signal power increases by a square law which outplays the linear increase of electrical noise power. For instance, by reducing a pulse slot duration by a factor 10, the bandwidth B increases by about a factor 10 as well, resulting in ten times the amount of electrical noise power, whereas the electrical signal power $(dI_{el})^2$ increases by a factor 100, resulting in an overall gain in electrical SNR by a factor 10. RF technologies just go with a linear increase in electrical signal power when increasing a RF signal pulse peak power into a narrower slot, resulting in no SNR gain, because electrical noise power increases by the same amount due to the higher bandwidth needed.

Since typically both an optical uplink channel and an optical downlink channel coexist in such a communications system, it turns out to be very difficult to provide for a proper separation of these two channels because of the huge difference in power levels when comparing both channels. In the following a situation is considered where a satellite terminal is millions of kilometers away from a ground station on the Earth. On the downlink an extremely high optical power has to be transmitted in order to ensure that at the ground terminal a signal of minimum energy is received that can still be detected. Such a signal may have an average power of some Picowatts or even below when it reaches the Earth. At the same time, however, signals received at the satellite terminal have traveled a very long distance, too. There can be a ratio between the signal strength of a signal emitted by the satellite terminal and a signal received by this terminal of about $10^{12}$. At these conditions even specially designed optical filters have difficulties to reliably provide for the necessary channel separation.

Instead of using continuous wave (CW) lasers which always emit light, according to the present invention pulsed power lasers are employed. Since the bridging of very long distance requires a certain amount of optical energy to arrive at the receiving terminal, a certain minimum amount of optical energy has to be fed into the optical communication channel. Instead of using a continuous output of optical energy, as with CW lasers, pulsed lasers are employed which emit short pulses of very high peak energy. The energy of these pulses has to be so high that integrated over the time the required minimum energy arrives at the receiving terminal.

If, however, one emits very high energy pulses (e.g. in the range between 10 W and 100 kW), any weak optical signal just arriving at the same terminal may be obstructed by scattered light of the outgoing high energy pulses. This again imposes further requirements on optical coatings which makes them even more difficult to produce.

According to the present invention a new approach is proposed that allows the link budgets of the uplink and the downlink to be optimized independently of each other. This, however, is only possible if there is a suitable separation of the up- and downlink channel provided at least on the (deep space-) satellite side, since at a satellite the power downlink transmitter and the highly sensitive uplink receiver cannot be spaced apart far enough.

As part of these considerations, hereinafter an appropriate modulation scheme is provided and a suitable error coding scheme is offered that can be employed, if needed.

According to the present invention a pulsed high-power laser source is employed at the ground station for transmitting a pulsed beacon laser signal, further referred as optical beacon pulses, into an optical point-to-point uplink channel. The high-power laser source is controlled so that it emits a few beacon laser signal pulses with a known repetition frequency. An active optical channel separation is now provided in that the power downlink transmitter at the satellite is prevented from emitting light while a beacon laser signal pulse is expected to arrive. That is, the power downlink transmitter does not issue any light during a very short time window, or the light emitted is deflected or reflected away from the sensitive receiver. So there is no scattered light that could obstruct the weak incoming beacon laser signal pulse.

There are various additional aspects that are discussed in the context of detailed embodiments. The advantages of these aspects will become apparent form the detailed description.

These and other aspects of the inventive apparatus are carried out by a bi-directional laser communications system comprising a first transceiver and a second transceiver for establishing two optical channels there between. The first transceiver comprises a first transmitter with a pulsed high-power laser source for transmitting optical beacon pulses into a first of said optical channels. The second transceiver comprises a receiver, a second transmitter and separation means. The receiver has a receiving optic for receiving said optical beacon pulses. The second transceiver and/or a receiving optic of said second transceiver is adjustable so that it can be adjusted with respect to said optical beacon pulses. The second transmitter has a laser for transmitting a high energy laser signal into a second of said optical channels. The separation means separates the first optical channel and the second optical channel and prevents with a certain degree of certainty said high energy laser signals from being transmitted into said second optical channel whenever said optical beacon pulses are expected to arrive through said first optical channel.

Various methods in accordance with the invention are carried out in accordance with a method for bi-directional laser-based communication between a first transceiver and a second transceiver, characterized by the following steps, which do not necessarily have to be carried out in the below order:
  generating a series of optical beacon pulses by said first transceiver and transmission of said optical beacon pulses across a first optical channel to said second transceiver,
  receiving and processing said optical beacon pulses by said second transceiver in order to enable said second transceiver and/or a receiving optic of said second transceiver to be adjusted with respect to said first optical channel,
  adjusting said second transceiver and/or a receiving optic of said second transceiver with respect to said first optical channel
  generating high energy laser signals by said second transceiver for transmission across a second optical channel to said first transceiver,
  transmitting said high energy laser signals across the second optical channel to said first transceiver if no optical beacon pulse is expected to arrive at said second transceiver, and
  suppressing transmission of said high energy laser signals if an optical beacon pulse is expected to arrive at said second transceiver.

BRIEF DESCRIPTIONS OF THE DRAWINGS

For a more complete description of the present invention and for further objects and advantages thereof, reference is made to the following description, taken in conjunction with the accompanying drawings, in which.

DETAILED DESCRIPTION OF THE PREFERRED EMBODIMENTS

Terms are used in connection with the present description which are also used in relevant publications and patents. However, it is to be noted that the use of these terms is merely to serve for better understanding. The ideas according to the present invention and the scope of protection of the claims are not to have their interpretation be restricted by the specific selection of terms. The present invention may be transferred without anything further to other conceptual systems and/or professional fields. The terms are to be applied appropriately in other professional fields.

The same reference numbers are used throughout the present text for identical and similar elements or features, but also for functionally similar elements or features of the invention.

When referring in the present context to optical channels, then unguided channels are meant. A channel is a link or connection. The expressions uplink and downlink, as well as the words first, second and so on, are only used to enable the reader to get a better and more easy understanding of the invention. These expressions and words are not meant to limit the scope of protection.

The present invention concerns a point-to-point communications system where a single uplink transmitter communicates with a single uplink receiver over a channel with a single input and single output. The system also comprises a single downlink transmitter that communicates data to a single downlink receiver. The system, however, is not limited to a single transmitter, only. Also, multi-channel transmission may be realised, for instance by wave division multiplexing.

The basic function of the present invention is now described in the context of a first embodiment. This embodiment is illustrated in FIG. 1.

This Figure shows a bi-directional, point-to-point laser communications system 10 which comprises a first transceiver 20 and a second transceiver 30. Both transceivers 20, 30 are designed for establishing optical channels A and B there between. The distance between the two transceivers 20, 30 typically is between a few kilometers and many hundreds of millions of kilometers.

In connection with the embodiments described in more detail, the focus is on long range communications systems, such as communications systems as used for communication between a ground station (e.g. the first transceiver 20) and a satellite station (e.g. the second transceiver 30) in the deep space. But the invention can also be used for shorter distance point-to-point communication for instance in case where the channels are obstructed due to fog or clouds.

Figure 1:
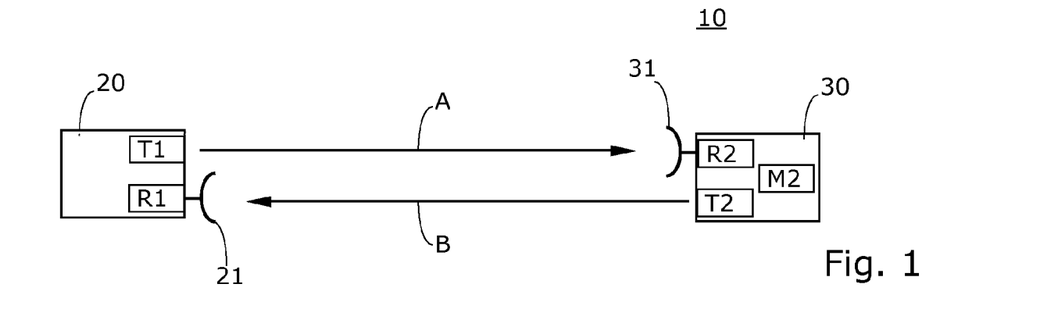
FIG. 1 shows a communications system in accordance with a first embodiment of the present invention.

The first transceiver 20 comprises a first transmitter T1, as schematically illustrated in FIG. 1. The first transmitter T1 comprises a pulsed high-power laser source (not shown in FIG. 1) for transmitting a pulsed beacon laser signal into a first of said optical channels A. This channel A is also referred to as uplink channel. Depending on the actual implementation of the invention, the first transceiver 20 may further comprise a receiver R1 with an optical antenna 21. The receiver R1, however, can also be located somewhere else (e.g. in a separate station).

The second transceiver 30 comprises a receiver R2 with receiving optics 31, an optical antenna in the present embodiment, for receiving the pulsed beacon laser signal. The optical antenna 31 and/or the receiver R2 is/are adjustable so that an adjustment with respect to the direction of the pulsed beacon laser signal can be provided. For this purpose, for instance, an optical antenna 31 is employed that can be tilted. Likewise, or in addition one may change the satellite's position in space to provide for an adjustment with respect to the uplink A.

The second transceiver 30 further comprises a second transmitter T2 with a power laser for transmitting a high energy laser signal into a second of said optical channels B. This channel B is also referred to as downlink channel. There are further means M2 for a separation or synchronization of the first optical channel A and the second optical channel B. These means M2 prevent with a certain degree of certainty (errors that occur from time to time can be dealt with at the protocol layer) the high energy laser signals from being transmitted into the second optical channel B while the pulsed beacon laser signal is expected to arrive through the first optical channel A. These means M2, which are shown is FIG. 1 as a dedicated physical entity, are in most cases implemented inside the transceiver 30 either purely in software, or as hardware (cf. FIG. 2B) or as a combination of soft- and hardware.

Since in most implementations the transmit pulses are issued or controlled by software in the transmitter T2, it is easy to suppress the respective pulse(s) during a so-called inhibit period. It is also possible, however, to implement the suppression by means of hardware. One could for instance add a gating unit G at an output side of the transmitter T2, as schematically depicted in FIG. 2B. This gating unit G will allow all electrical pulses to pass from a laser modulator 33 to the laser 32, for instance (cf. FIG. 2B). If, however, the gating unit G has received a trigger or a respective signal S from an internal clock of the second transceiver 30 (this clock being synchronized with the clock of the first transceiver 20), then the gating unit G blocks the electrical pulses for a short period (inhibit period) of time. This trigger or signal S may also be provided by some other component of the transceiver 30.

According to the present invention, the pulsed high-power laser source of the first transmitter T1 transmits a pulsed beacon laser signal into the optical uplink channel A. The high-power laser source is controlled so that it emits a few beacon laser signal pulses with a known repetition frequency. The required optical channel separation is provided in that the power laser of the downlink transmitter T2 at the satellite is prevented from emitting light while a beacon laser signal pulse is expected to arrive. That is, the downlink transmitter T2 does not issue any light during a very short time window. This can be done, for instance, by omitting one or more modulation triggers, when triggering the power laser in T2.

Likewise, or in addition the transmitter T2 emits light even while the beacon laser signal pulse is expected to arrive, but the light is deflected or reflected away from the sensitive receiver R2 or optical antenna 31.

No matter how the suppression, deflection or reflection is implemented, as a consequence there will be no scattered light that could obstruct the weak incoming beacon laser signal pulse.

Figure 2A:
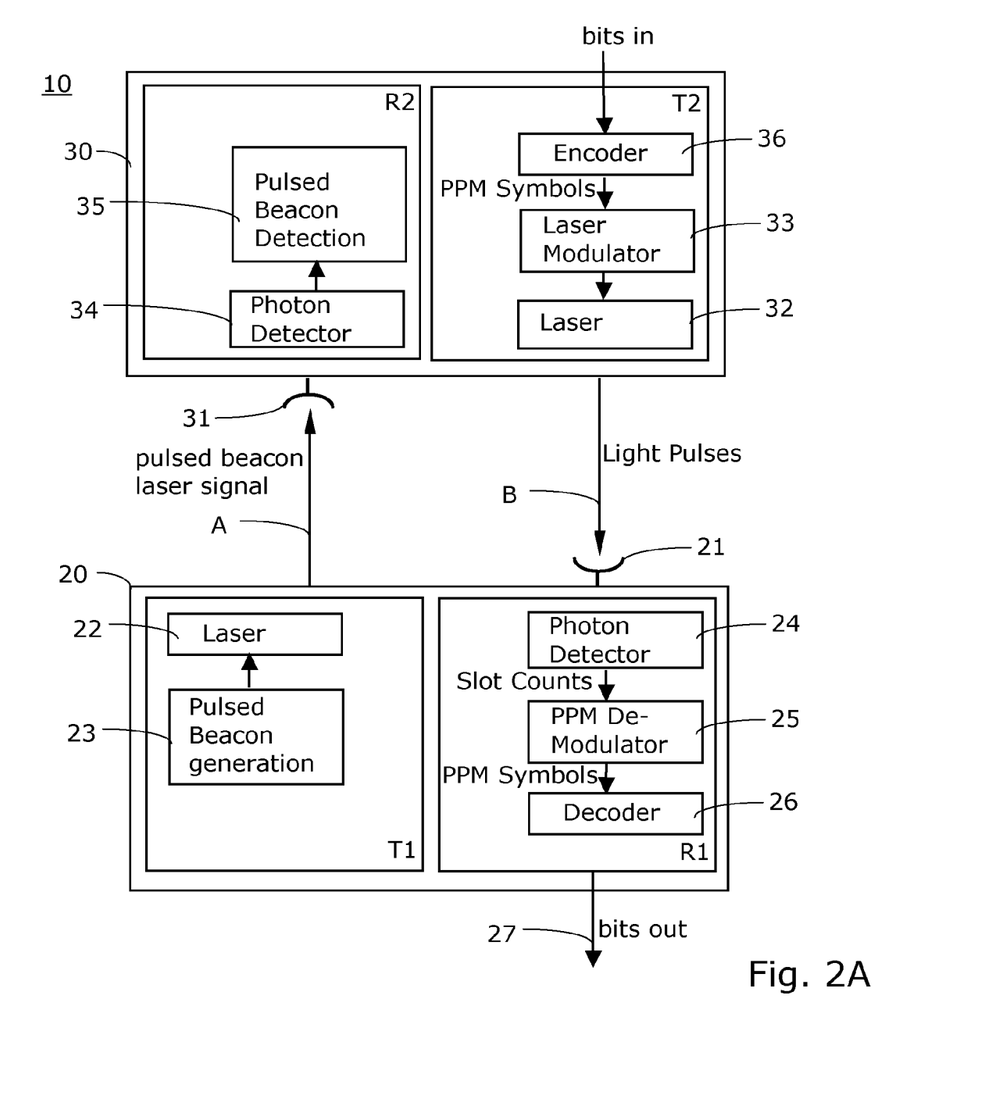
FIG. 2A shows another communications system in accordance with a second embodiment of the present invention.
Figure 2B:
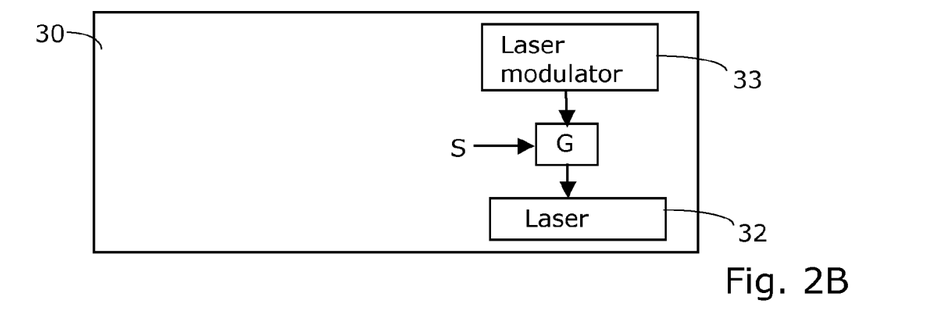
FIG. 2B shows one possible implementation for the suppression of outgoing optical signals in accordance with a second embodiment of the present invention.

Another embodiment is illustrated in FIGS. 2A and 2B. The block diagram of these Figures is more detailed than the one of FIG. 1. Some or all of the aspects discussed in context with FIGS. 2A and 2B can also be applied to the other embodiments.

The first transceiver 20 of FIG. 2A again comprises a first transmitter T1. The first transmitter T1 comprises a pulsed high-power laser source 22 for transmitting a pulsed beacon laser signal into the first channel A. The transmitter T1 includes means 23 for the generation of a pulsed beacon signal. Depending on the actual implementation of the invention, the first transceiver 20 may further comprise a receiver R1 with an optical antenna 21. In the present embodiment, the receiver R1 comprises a photon detector 24 (preferably an Avalanche photo diode or a photo transistor), arranged so that it receives optical signals collected by the optical antenna 21. Since in the present embodiment a PPM modulation scheme is employed for the downlink communication via channel B, a PPM demodulator 25 followed by a decoder 26 are employed. At the output side 27 a sequence of bits (bits out) is provided. This sequence of bits corresponds to the bits that were transmitted (bits in), if no errors occurred during the transmission.

The second transceiver 30 comprises a receiver R2 with an optical antenna 31 for receiving the pulsed beacon laser signal. The receiver R2 comprises a photon detector 34 (preferably a photo diode or photo transistor), and means 35 for the detection/processing of the pulsed beacon laser signals.

The second transceiver 30 further comprises a second transmitter T2 with a power laser 32 for transmitting a high energy laser signal into channel B. The means for the separation of the optical channels A and B are not shown in FIG. 2A. As mentioned above, the separation scheme for the channel separation can be implemented in software, hardware or a combination of both inside the transceiver 30. The transceiver 30 further comprises an encoder 36 for a suitable encoding of the bits to be transmitted (bits in), and a laser modulator 33 to modulate the laser signal.

Like in the previous embodiment, the laser 32 is prevented from sending disturbing high energy laser signals while the pulsed beacon laser signal is expected to arrive through the channel A.

An example of a hardware implementation of the separation scheme is illustrated in FIG. 2B. In this Figure details of an embodiment are shown where, as described above, a gating unit G is employed. The gating unit G receives a trigger or a respective signal S from an internal clock of the second transceiver 30 (this clock being synchronized with the clock of the first transceiver 20). Upon receipt of the signal S, the gating unit G blocks the electrical pulses for a short period (inhibit period) of time. This trigger or signal S may also be provided by some other component of the transceiver 30.

Figure 3:
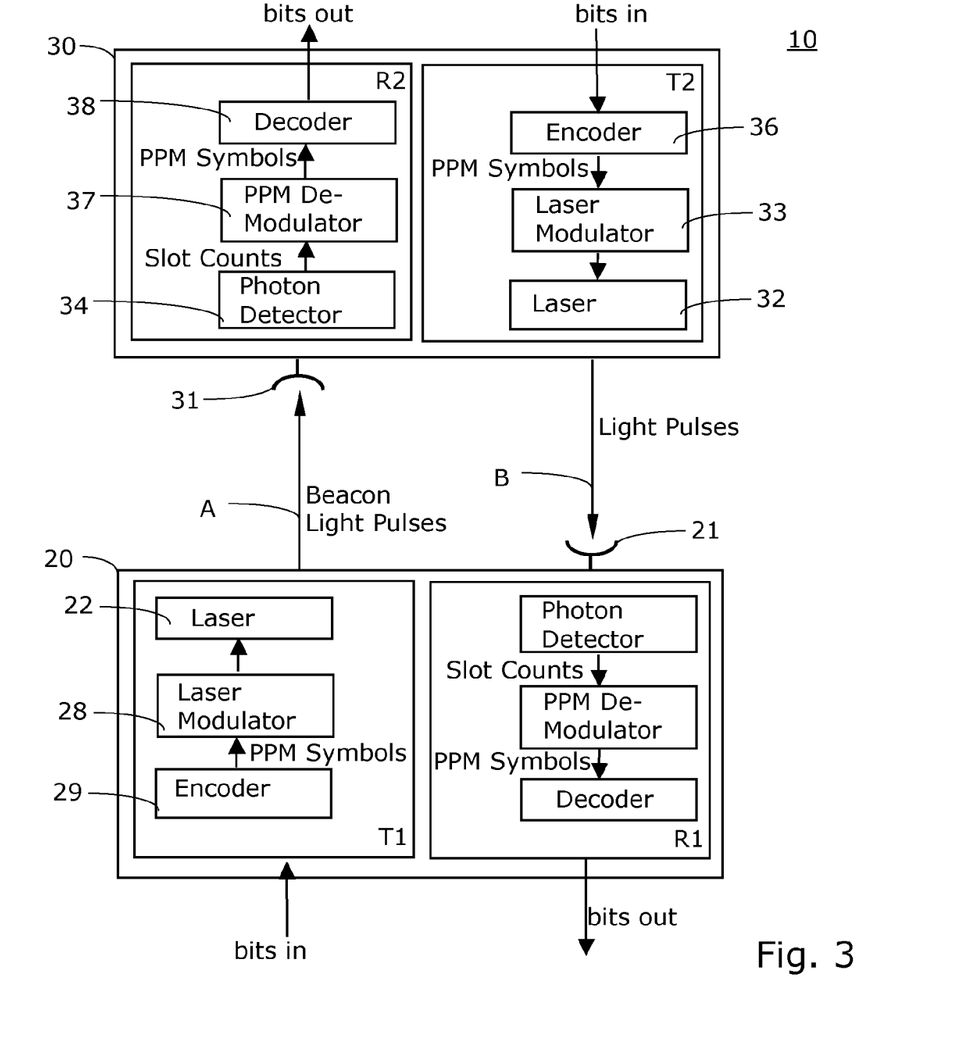
FIG. 3 shows another communications system in accordance with a third embodiment of the present invention.

The communications system 10 of FIG. 3 is more sophisticated than the one shown in FIG. 2A, since now both channels A and B are PPM modulated channels. So not only the downlink B is used to carry data (payload) in PPM frames, but also the uplink beacon signal is carrying PPM frames with data. It is to be noted, however, that the downlink has a higher bandwidth than the uplink. On the uplink one may use a low PPM scheme like, 2-slot, whereas on the downlink a high PPM scheme could be used, using e.g. 8-, 64-, 256- or more slots just to give a few examples. It has also to be considered that the uplink PPM scheme has to have a fairly long blank time, as will be discussed in connection with the FIGS. 4-6, whereas the blank time for the downlink can be much shorter.

Since the embodiment of FIG. 3 in some respect is similar to the previous ones, only the most important differences will be addressed in the following.

Since in the embodiment of FIG. 3 also on the uplink a PPM modulation scheme is used, the first transmitter T1 comprises an appropriate encoder 29 and a laser modulator 28, referred to as beacon pulse modulator. At the other end of the link, the receiver R2 comprises the respective receiver electronics. In the present case the receiver R2 comprises a PPM demodulator 37 and a decoder 38. The fact that data can be transmitted across the uplink channel A is shown in FIG. 3, where data (bits in) are fed into the transmitter T1 and corresponding data (bits out) are provided at an output of the receiver R2.

Before further embodiments are addressed, the reason why PPM is used and further aspects of the invention are discussed. PPM modulation in the present case is much better suited than OOK (on-off keying), since an optical PPM channel can transmit a higher peak power than an optical OOK channel. High optical peak powers are required to overcome huge link distances or high attenuations (e.g. caused by clouds or fog) that cause rather faint optical receive power levels and in addition require very sensitive detectors. The "square-law" of electro-optical power conversion (described above) pays off especially when pulse peak powers can be increased by maintaining the optical average power level which corresponds to the electrical average power level. The latter is achieved by decreasing the pulse duration by a factor m, for instance, which leads to a linear increase of the electrical SNR by the same factor m. The only limitation for such increase is given by the physical nature of pulse generation in lasers and by the detector bandwidth that has to match the pulse duration accordingly. Both in combination are herein used to create highly sensitive optical signal transmissions.

In the PPM format, there are L symbols, each of duration $T_{SYMB}$. Each symbol is divided into L chips or slots (with duration $T_{SLOT}=T_{SYMB}/L$). The PPM duty cycle is $\alpha_{PPM}=1/L$. The transmitter T1 or T2 sends an optical pulse in only one of these chips at a time.

Figure 4:
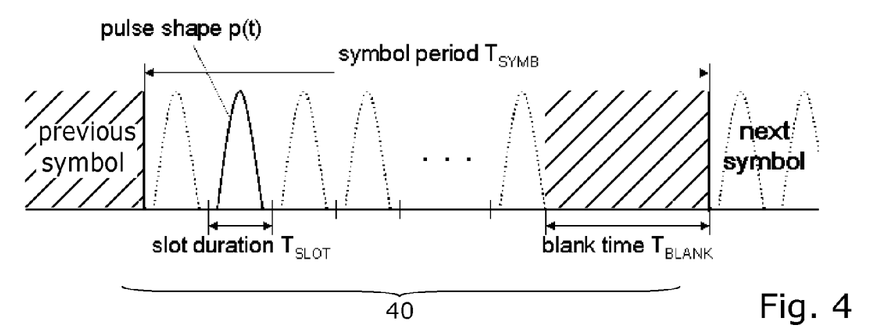
FIG. 4 shows an example of a PPM modulation scheme, as used in connection with the present invention.

The symbol period $T_{SYMB}$ of a PPM frame 40 is illustrated in FIG. 4. Each PPM frame 40 has a given number of L slots, where each slot has the same slot duration $T_{SLOT}$. In case of an 8-slot PPM scheme, there are thus 8 slots in each frame 40 (L=8). In addition, there is a so-called blank time $T_{BLANK}$ at the end of each frame 40. This blank time is important for the present invention, since the laser sources used for the transmission of pulsed light signals cannot be switched on and off arbitrarily. The more optical power such a laser source is supposed to transmit in a single pulse, the more time it needs until the laser source can emit the next pulse. So if no blank time would be used at the end of each frame 40, it might happen that a pulse is emitted in the last slot of a first frame and that another pulse follows in the first slot of the next frame. Latter is possible only for a dedicated, limited sub-set of pulsed laser sources and not for all laser source types. More general, according to the present invention, the blank time of each channel is adjusted/selected so that even in such a case there is enough idle time for the laser source between subsequent light pulses.

Figure 5:
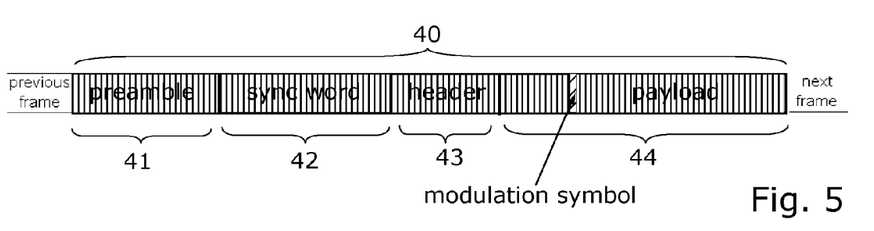
FIG. 5 shows an example of a PPM frame, as used in connection with the present invention.

Each PPM frame 40 has a pre-defined structure, as schematically illustrated in FIG. 5. The frame 40 starts with a preamble 41, a synchronization word 42 (synch word), and a header 43. After the header 43 the payload portion 44 follows. The payload portion 44 is the part of the PPM frame 40 that carries the actual information (data). Preferably, the preamble 41 is a train of regularly spaced laser pulses. The preamble 41 is used at the receiver side to detect the arrival of a new frame and to perform a coarse synchronization to the phase of the incoming signal. The synchronization word 42 is used by the receiver to find the exact start of the header in the frame, which is why the synchronization word 42 is a train of laser pulses whose autocorrelation is close to a Dirac-delta function. The header 43 is used by the receiver to identify the frame after the symbol positions have been decoded to bits.

As illustrated in FIG. 5, the modulation symbol is present in the payload part 44 of the frame 40. The modulation symbol is a PPM symbol, i.e., the time period $T_{symb}$ gives as $T_{slot}$ times the number of PPM slots.

Figure 6A:
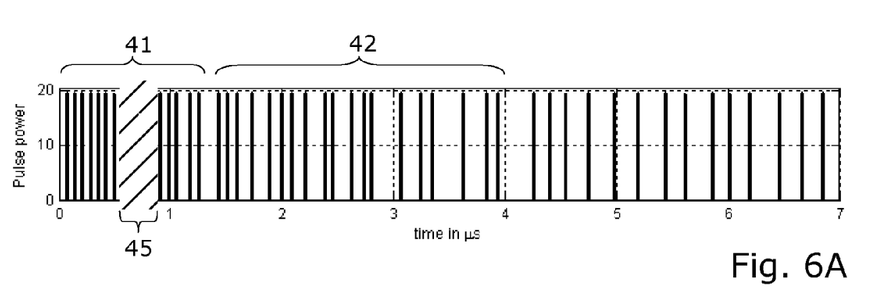
FIG. 6A shows an example of a PPM modulation scheme applied to the optical downlink channel, as used in connection with a preferred embodiment of the present invention.
Figure 6B:
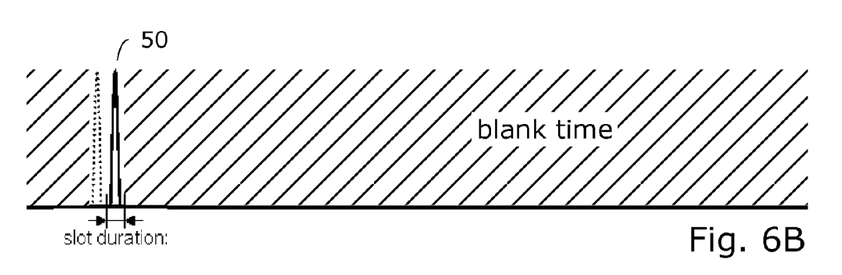
FIG. 6B shows an example of a modulation scheme applied to the optical uplink channel, as used in connection with the embodiment of FIG. 6A.

FIGS. 6A and 6B are now used in order to describe the relationship between the two channels A and B. The uplink channel A (e.g. an uplink channel from a ground station to a satellite in deep space) is represented in FIG. 6B and the downlink channel B (e.g. a downlink channel from the satellite to the ground station) in FIG. 6A. In both Figures the optical output power of the respective laser is shown versus the time in µs. Assuming that the downlink channel B is active, a very dense sequence of pulses is transmitted as preamble 41. Then the pulses of the synch word 42 follow. In the example depicted in these two Figures, a 16-slot PPM with a pulse width of 10 ns is used for this downlink channel B and the average pulse repetition period is 200 ns.

While the transmitter T2 is emitting the preamble pulses, a beacon pulse 50 is expected to arrive via the uplink channel A. This beacon pulse 50 in the present example has a pulse width (pulse duration) of 6 ns. If no PPM modulation is employed on this uplink channel A, then the position of this single pulse 50 is pretty well known to the receiver (provided that at least the transceiver 30 is synchronized with respect to the transceiver 20), and the transceiver 30 can take measures to make sure that either no pulses are emitted into the downlink channel B or that the light is deflected or reflected away from the sensitive optical receiver parts of the receiver R2. If, however, a 2-slot PPM modulation scheme (L=2) is used on the uplink, then the position of the beacon pulse 50 could either be in the second slot (dark solid line in FIG. 6B) or in the first slot (doted line in FIG. 6B). In this case the time window during which the downlink signals have to be cancelled out is a bit longer. This time window is referred to as inhibit period 45.

As stated above, the link budget has to be carefully designed. In case of the downlink channel B, where a 16-slot PPM is used in the above example, the blank time could be 40 ns. In this case, 16 times 10 ns (the pulse width is 10 ns) plus the blank time adds up to symbol period $T_{SYMB}$=200 ns. During these 200 ns there will be just one pulse emitted by the laser 22 of the transmitter T2. If this laser pulse has a power of 20 W, this means that the average power transmitted per frame 40 is 1 W (since the duty cycle 20).

In a preferred embodiment of the invention, for the synch word 42 a different PPM modulation is used, as in the payload portion 44. It is advantageous to use a PPM modulation for the synch word 42 where there are many "0" and few "1" in order to provide for a good autocorrelation at the receiver R1. The synch word 42 should be defined so that the same sequence of pulses does not occur in the payload portion.

In a preferred embodiment, the blank time of the uplink A is between 10 and 100 µs and a 2-slot PPM is used on this link. If the uplink is PPM modulated, the uplink channel A can serve as a service channel to send some information for instance from the ground station to the satellite (as illustrated in FIG. 3).

The present invention is characterized in that it can be implemented, if needed, so that it provides a service channel that could be used for a communication from a first transceiver 20 (e.g. a ground station) to a second transceiver 30 (e.g. a satellite).

So far the synchronization between the first and second transceivers 20, 30 has not been addressed in detail. In the following some more aspects of a suitable synchronization scheme are addressed. These details can be applied to any of the embodiments. If a proper synchronization is achieved between the two remote stations 20, 30, then it is easier for the second transceiver 30 to predict or determine when the next beacon pulse 50 is expected to arrive. That is, the second transceiver 30 can determine when the inhibit period 45 is supposed to start. This is possible since the beacon signal has a fixed frequency. According to the present invention, the second transceiver 30 synchronizes on the received beacon pulses 50. It needs to receive at least three pulses 50 in order to be able to do a proper synchronization. Once the synchronization is achieved, the whole process, as explained above, can be initiated.

In a second phase, the first transceiver 20 can also be synchronized with respect to the second transceiver 30, if needed. This, however, will take somewhat longer than the synchronization of the second transceiver 30 with respect to the first transceiver's time base.

Figure 7:
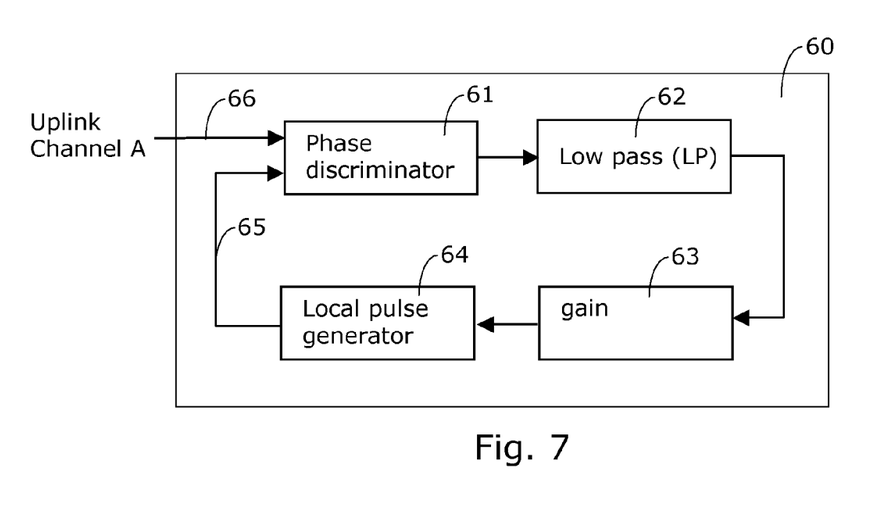
FIG. 7 shows a unique implementation of a digital phase-locked-loop which is designed for use in a communications system in accordance with the present invention.

In a preferred embodiment, the transceiver 30 comprises a very special and unique phase-locked loop (PLL) arrangement 60, as illustrated in FIG. 7. The problem in communication over very long distances, or through disturbed channels is that the optical signals which eventually arrive at the second transceiver 30 are very noisy. Special measures have to be taken at this end of the optical link to ensure that the transceiver 30 is able to detect the beacon pulses 50. So one needs a PLL that is able to lock the incoming beacon pulses 50.

The PLL 60 according to the present invention is a feedback system combining a local pulse generator 64 and a phase discriminator 61 so that the local pulse generator 64 issues pulses at an output 65 which—after a few beacon pulses 50 have been received—accurately track the beacon pulses 50 received at an input 66. The PLL 60 further comprises, as illustrated in FIG. 7, a low-pass filter 62 (LP) and a gain unit 63. The PLL 60 is used to generate stable optical output pulses with a phase and frequency that matches the phase and frequency of the beacon pulses 50 received. The PLL 60 is very special since it is a digital PLL. The phase discriminator 61 is designed so that it is able to determine very precisely (with a resolution of picoseconds) the phase difference $\Delta T$ between the beacon pulses 50 received and the optical output pulses at the output 65.

The PLL 60 is designed so that it is able to operate on pulses which are close to the Nyquist Limit.

It is an advantage of the invention that it provides for a huge power separation between the optical beacon signal received by the second transceiver 30 (e.g. a satellite) and the optical power transmitted into the downlink channel B.

It is a key aspect of the present invention that the transmitted optical power is shut off, deflected or reflected away when the beacon pulse is expected to arrive. Transmission errors on the downlink introduced due to these disturbances or interruptions in the physical communications layer can be dealt with by an appropriate forward error correction (FEC) scheme. This means that these errors can be dealt with inside a protocol layer. Well suited is a Turbo-code. By combining electrical means and software in the described manner, an optical power separation between multiple optical channels can be achieved. The transceiver 30 may for instance comprise an appropriate FEC encoder which encodes the data (bits in) which are to be transmitted via the downlink. The FEC encoder adds redundancy to this data stream and it allows the transceiver 20 to detect and to correct transmission errors.

The original idea of turbo coding is to combine two elements: parallel concatenation of two or more codes separated by a random interleaver at the transmitter T2, and iterative decoding at the receiver R1. The use of turbo codes with iterative decoding schemes achieved reliable data communications at low signal-to-noise ratios (SNRs), very close to the Shannon limit.

The turbo codes are herein used because of their error performance and their reasonable decoding complexity.

As stated above, the beacon signal can also be used to carry some service information. In this case the beacon shows some periodicity. In other words, the position of the beacon pulse is varied in order to carry the information sent across the service channel (cf. FIG. 6B). In such a case the inhibit period 45 has to be a bit longer.

In a preferred embodiment, an RF signal is employed in order to allow the remote second transceiver to be alerted (wake-up). This will enable the second transceiver 30 to activate the onboard receiver R2 so that this receiver R2 is able to receive the beacon pulse and to perform the synchronization, if a synchronization is desired. If one uses an RF wake-up signal, the second transceiver 30 can be kept in a mode where it consumes less power. This can be important in missions where there are power constraints.

A pulsed laser is employed according to the present invention that can successfully confine a large pulse energy to a narrow PPM slot. Well suited for the present invention are Q-switch lasers and/or fiber optical amplifiers. The Q-switch lasers typically are able to emit higher peak energies than the fiber optical amplifiers, but they require a longer blank time. This means that Q-switch lasers are better suited for low pulse repetition frequencies and very high pulse peak power (up to 100 kW and more), e.g. shown in the first transceiver 20, whereas fiber optical amplifiers are better suited for high pulse repetition frequencies and moderate pulse peak power (about 1 kW), e.g. being employed in the second transceiver 30.

In a further preferred embodiment, the second transceiver 30 comprises software that will enable the second transceiver 30 to run a link optimization procedure. During this procedure, the second transceiver 30 is able to optimize the transmission behavior taking into consideration the frequency of the beacon signal and other aspects.

According to a preferred embodiment of the present invention, a turbo-coded PPM communications system 10 is employed in a very special manner in order to provide for the necessary channel separation. The pulse position modulation used herein can be efficiently combined with the convolutional turbo coding or some other FEC.

According to a further preferred embodiment of the present invention, an FEC decoder is employed inside the transceiver 20 which is provided with SNR information or information about the actual likelihood ratio. With this additional information, the FEC decoder will be able to provide for better decisions, that is the transmitted data is reconstructed at the receiver side with fewer errors.

The design of the ground optical telecommunications terminal (transceiver 20) is based upon a design concept that comprises a receiving system R1, a transmit system T1, as well as data processing and support electronics. The receiving system R1 may comprise a primary mirror with a monolithic secondary mirror in a Cassegrain configuration. Some of the optical components behind this mirror configuration may be situated on an optical bench.

The spaceborne terminal (transceiver 30) may comprise three main subsystems, namely an acquisition subsystem, a tracking subsystem, and a pointing subsystem. The acquisition subsystem comprises a receiver R2 with an optical antenna 31. The transceiver 30 further comprises a transmitter subsystem T2, a transmit aperture and some associated optics. This terminal preferably uses internal steering elements for beam pointing stabilization. The optical transceiver 20 typically has an interface with the satellite.

In a preferred implementation of a long distance beacon uplink the pulses of the pulsed beacon laser signal 50 may have a pulse width of less than 100 ns, preferably less than 10 ns, and are emitted with a repetition frequency in the range between 1 kHz and 100 kHz and preferably in the range between 4 kHz and 32 kHz.

For other kinds of links, such as between satellites or air-to-air, according to the present invention the actual repetition frequencies (PRF) depend on the link scenario, available laser source and channel characteristics. When used for communications, all these parameters typically require PRF values from the kHz regime up to the MHz regime.

According to the present invention an active beacon-assisted acquisition and tracking approach is employed where an uplink laser beacon is tracked by the satellite in deep space.

The invention presented herein is also very well suited for space communications across the solar system, including among others inter-planetary links, formation flights (air-to-air), intersatellite links between planetary orbits and satellite—ground, or satellite—aerial vehicle scenarios. "Ground" in this sense includes both, fixed and mobile ground stations.

The invention can also be employed for communicating inside or across the atmosphere, since it is very robust even in situations where the channel is disturbed by clouds or fog.

What is claimed is:

1. Bi-directional laser communications system comprising a first transceiver and a second transceiver for establishing two optical channels there between, wherein
    said first transceiver comprises a first transmitter with a pulsed high-power laser source for transmitting optical beacon pulses into a first of said optical channels,
    said second transceiver comprises
        a receiver with a receiving optic for receiving said optical beacon pulses, said second transceiver and/or a receiving optic of said second transceiver being adjustable so that it can be adjusted with respect to the direction of said optical beacon pulses,
        a second transmitter with a laser for transmitting a high energy laser signal into a second of said optical channels, and
        means for synchronization of said first optical channel and said second optical channel, said means preventing said high energy laser signals from being transmitted into said second optical channel whenever said optical beacon pulses are expected to arrive through said first optical channel.

2. The communications system of claim 1, wherein said optical beacon pulses are transmitted into said first optical channel with a pre-defined repetition rate and wherein said second transceiver is able to synchronize on the basis of pulses of said optical beacon pulses.

3. The communications system of claim 2, wherein after synchronization said means are aware when to prevent said high energy laser signals from being transmitted.

4. The communications system of claim 1, wherein said second optical channel is a long distance downlink and wherein a pulse-position modulation (PPM) scheme is applied in said second transceiver prior to the transmission of said high energy laser signal, where pulses of a pulse width of less than 50 ns, preferably equal to or less than 10 ns are emitted.

5. The communications system of claim 4, wherein a pulse-position modulation scheme is applied in said first transceiver prior to the transmission of said optical beacon pulses, and wherein due to the application of the pulse-position modulation scheme a service channel is embedded in or provided by said first optical channel.

6. The communications system of claim 4, wherein a forward-error correction scheme, preferably a turbo-coding scheme, is applied in said second transceiver in order to deal with transmission errors introduced by suppression of said high energy laser signals whenever said optical beacon pulses are expected to arrive.

7. The communications system of claim 6, wherein a decoding scheme is employed in said first transceiver in order to calculate said transmission errors, which are deterministic errors.

8. The communications system of claim 1, wherein said first optical channel is a long distance beacon uplink and wherein the pulses of the optical beacon pulses have a pulse width of less than 100 ns, preferably less than 10 ns, and are emitted with a repetition frequency in the range between 1 kHz and 100 kHz and preferably in the range between 4 kHz and 32 kHz.

9. The communications system of claim 1, wherein said high-power laser source of the first transceiver has an optical output power which is at least 100 times higher than the optical output power of a laser of said second transmitter.

10. The communications system of claim 1, wherein link budgets of said first optical channel and said second optical channel are different, but where the signal-to-noise ratio (SNR) at the respective receiving optics is similar.

11. The communications system of claim 1, wherein a digital phase-locked-loop is employed in said second transceiver in order to lock the pulses of said optical beacon pulses.

12. The communications system of claim 1, wherein the communications system is one of a point-to-point
    space-to-ground, preferably deep space-to-ground/aerial vehicle,
    ground/aerial vehicle-to-space, preferably ground-to-deep space, or
    air-to-air,
communications system.

13. The communications system of claim 1 being a point-to-point ground-to-ground communications system where said optical channels at least partially run through or touch the atmosphere.

14. Method for bi-directional laser-based communication between a first transceiver and a second transceiver, characterized by the following steps:
    generating a series of optical beacon pulses by said first transceiver and transmission of said optical beacon pulses across a first optical channel to said second transceiver,
    receiving and processing said optical beacon pulses by said second transceiver in order to enable said second transceiver and/or a receiving optic of said second transceiver to be adjusted with respect to the direction of said first optical channel,
    adjusting said second transceiver and/or a receiving optic of said second transceiver with respect to said first optical channel,
    generating high energy laser signals by said second transceiver for transmission across a second optical channel to said first transceiver, transmitting said high energy laser signals across the second optical channel to said first transceiver when no optical beacon pulse is expected to arrive at said second transceiver, and suppressing transmission of said high energy laser signals when an optical beacon pulse is expected to arrive at said second transceiver.

15. The method of claim 14, wherein:

the steps of generating said series of optical beacon pulses comprises generating said series of optical beacon pulses to have a pre-defined repetition rate, and the steps of transmitting and suppressing include performing a synchronization inside said second transceiver on the basis of pulses of said optical beacon pulses.

16. The method of claim 14, comprising the step:

applying a pulse-position modulation (PPM) scheme in said second transceiver prior to the transmission of said high energy laser signal, where pulses of a pulse width of less than 50 ns, preferably equal to or less than 10 ns, are emitted.

17. The method of claim 14, wherein the pulses of the optical beacon pulses on a long distance beacon uplink have a pulse width of less than 100 ns, preferably less than 10 ns, and are emitted with a repetition frequency in the range between 1 kHz and 100 kHz and preferably in the range between 4 kHz and 32 kHz.

18. The method of claim 14, comprising the step:

applying a pulse-position modulation scheme in said first transceiver prior to the transmission of said optical beacon pulses, wherein due to the application of the pulse-position modulation scheme a service channel is embedded or provided.

19. The method of claim 14, comprising the step:

applying a forward-error correction scheme, preferably a turbo-coding scheme, in said second transceiver in order to deal with transmission errors introduced by a suppression of said high energy laser signals whenever said optical beacon pulses are expected to arrive.

* * * * *